United States Patent
Ramsey

(10) Patent No.: US 9,553,225 B2
(45) Date of Patent: Jan. 24, 2017

(54) TAPERED TRUNKING SYSTEM WITH DISTRIBUTED COMBINER

(75) Inventor: James R. Ramsey, Murfreesboro, TN (US)

(73) Assignee: Schneider Electric USA, Inc., Andover, MA (US)

(*) Notice: Subject to any disclaimer, the term of this patent is extended or adjusted under 35 U.S.C. 154(b) by 612 days.

(21) Appl. No.: 13/444,445

(22) Filed: Apr. 11, 2012

(65) Prior Publication Data

US 2013/0269746 A1 Oct. 17, 2013

(51) Int. Cl.
  H01L 31/042 (2014.01)
  H01R 4/00 (2006.01)
  H01L 31/05 (2014.01)
  H02S 40/36 (2014.01)

(52) U.S. Cl.
  CPC ........... H01L 31/05 (2013.01); H02S 40/36 (2014.12); Y02E 10/50 (2013.01)

(58) Field of Classification Search
  CPC ............. H01L 31/05; H02G 3/06; H02S 40/36
  USPC ........................................ 136/244; 174/84 R
  See application file for complete search history.

(56) References Cited

U.S. PATENT DOCUMENTS

| | | | |
|---|---|---|---|
| 6,268,559 B1 | 7/2001 | Yamawaki | |
| 6,307,144 B1 | 10/2001 | Mimura et al. | |
| 7,804,022 B2 | 9/2010 | De Ceuster | |
| 2005/0061360 A1 | 3/2005 | Horioka et al. | |
| 2009/0207543 A1* | 8/2009 | Boniface et al. | 361/86 |
| 2009/0293863 A1 | 12/2009 | Augenbraun et al. | |
| 2010/0085670 A1 | 4/2010 | Palaniswami et al. | |
| 2010/0139733 A1 | 6/2010 | Jonczyk et al. | |
| 2010/0237703 A1 | 9/2010 | Stern | |
| 2011/0011642 A1 | 1/2011 | Solon | |
| 2011/0162689 A1 | 7/2011 | Ueda et al. | |

(Continued)

FOREIGN PATENT DOCUMENTS

| | | |
|---|---|---|
| CN | 101997241 A | 3/2011 |
| CN | 102255571 A | 11/2011 |

OTHER PUBLICATIONS

Anders et al., Parameters affecting economic selection of cable sizes, IEEE Transactions on Power Deliver, vol. 8, No. 4, 1993.*

(Continued)

*Primary Examiner* — Devina Pillay
*Assistant Examiner* — Dujuan Horton
(74) *Attorney, Agent, or Firm* — Locke Lord LLP

(57) ABSTRACT

A tapered trunking bus for carrying electricity from a row of solar panel arrays to a safety switch. The trunking bus includes a number of combiner and junction boxes connected in series. Each successive combiner and junction box combines the output of the previous combiner and junction box, received on a conductor of a first cross-sectional area, with electrical current received from a pair of solar panel arrays and outputs a higher current on a conductor of higher cross-sectional area. The cross-sectional area of each conductor is chosen to match the current to be carried and to account for the distance to the next combiner and junction box. For lower current segments of the trunking bus, cables or wires in conduits, of increasing gauges, can be used between combiner and junction boxes. For higher-current segments, metal bus bars of increasing cross-sectional area can be used between combiner and junction boxes.

24 Claims, 9 Drawing Sheets

(56) References Cited

U.S. PATENT DOCUMENTS

2011/0209741 A1    9/2011  Solon
2011/0244719 A1*  10/2011  Xue et al. .................... 439/575
2012/0043988 A1    2/2012  Ramsey et al.

OTHER PUBLICATIONS

International Search Report corresponding to co-pending International Patent Application Serial No. PCT/US2010/034592, European Patent Office, Dated Jun. 11, 2013; (4 pages).
International Written Opinion corresponding to co-pending International Patent Application Serial No. PCT/US2013/034592, European Patent Office, dated Jun. 11, 2013; (5 pages).
First Office Action for Chinese Application Serial No. 201380030409.1, based on International Application Serial No. PCT/US13/034592 dated Feb. 3, 2016 (No Translation available).

* cited by examiner

TAPERED TRUNKING SYSTEM WITH DISTRIBUTED COMBINER

FIELD OF THE INVENTION

The invention relates to solar panel systems, and more particularly to trunking system for transporting electrical current from a field of solar panel arrays.

BACKGROUND OF THE INVENTION

A solar field typically includes a plurality of rows of solar panel arrays. A solar panel can generate 20-50 VDC at a current of 6-10 A. Each solar panel array can have several solar panels joined together to generate a desired voltage (e.g., 600 VDC or 1000 VDC). For example, an array with twelve solar panels wired in series, each generating 50 VDC at 8.5 A, can generate a voltage of 600 VDC at a current of 8.5 A.

FIG. 8 shows an exploded view of an example prior art row of solar panel arrays 10. Row 10 includes a plurality of solar panel arrays, including arrays 12 and 14. Each array 12, 14 includes a plurality of solar panels 16, for example two rows of six panels, or twelve panels. Each array is coupled directly to a combiner box 20, generally through fuses in the combiner box 20. The combiner box 20 combines the current from each of the arrays in series to produce a high current (e.g., 8.5 A×18 arrays=approximately 155 A) at the desired voltage (e.g., 600 VDC). The combiner box 20 can be a great distance from specific arrays. For example, if FIG. 8, arrays 12 and 14 are shown to be 378 feet and 357 feet away, respectively, from the combiner box 20.

The conductors used to carry current from the arrays to the combiner box vary in size from wires or cables carried in conduits to thick metal bars (bus bars). The cross-sectional area of the conductor (e.g., wire gauge) necessary to carry current from a specific array to the combiner box depends on the amount of current it is to carry and the distance from the array to the combiner box. In FIG. 8, the combined cross-sectional area of the example conductors is 137 mm$^2$.

Wiring a solar field can require a large amount of resources and labor. The conductors carrying current directly from each array to the combiner box is lengthy and thick, requiring a large amount of metal. If row length is approximately 378 feet from the combiner box, each row includes 18 arrays, and the field includes 16 rows of arrays, the field may require on the order of 20 miles of wire. Because the conductors must carry current across a great distance, the total cross-sectional area can be large (e.g., 137 mm$^2$ in the example of FIG. 8). Since wire gauges are sold in standardized sizes, if the precise cross-sectional area is not available, a larger-than-necessary gauge may be required, adding to the materials cost.

Installation of a solar field requires skilled electricians. For each pair of conductors, a conduit must be separately run from the array to the combiner box. Two wires (e.g., for positive and negative current) are run through each conduit from each array to the combiner box. This requires a large amount of labor and is difficult to trouble shoot and maintain. Moreover, each conductor is typically fused at the combiner box, potentially exposing the electricians and maintenance personnel to live electricity when the arrays are exposed to sunlight.

BRIEF SUMMARY

The present disclosure provides a tapered trunking bus for carrying electricity from a row of solar panel arrays to a safety switch. The trunking bus includes a number of combiner and junction boxes connected in series. The first combiner and junction box combines the electricity from a pair of solar panel arrays and outputs electricity of the desired voltage on a conductor. The cross-sectional area of the conductor is chosen to match the current to be carried and to account for the distance to the next combiner and junction box. Each successive combiner and junction box combines the output of the previous combiner and junction box with the electrical current received from another pair of solar panel arrays and outputs a higher current at the desired voltage.

The output current of each successive combiner and junction box will be higher than the input current since the current from two more arrays will be added. Accordingly, the gauge or cross-sectional area of the output conductor for each combiner and junction box will be larger than that of the input conductor. For lower current segments of the trunking bus, wires in conduits, of increasing gauges, can be used between combiner and junction boxes. For higher-current segments, metal bus bars of increasing cross-sectional area can be used between combiner and junction boxes. Because the conductors between each successive combiner and junction box are progressively larger than the ones before, the trunking bus can be considered tapered.

The distance between each combiner and junction box is short relative to the distance between each array and the safety switch. Thus, throughout the solar field, for nearly all of the solar panel arrays, the length of the conductors carrying current from each pair of solar panel arrays to the next pair is shorter (in most cases significantly shorter) than would be necessary to run conductors directly from each solar panel array to a single combiner box for a row of panels. This reduces the lengths of the conductors necessary to carry electricity from the arrays to the safety switch, and as a result, significantly reduces the overall length of conductors. It also reduces the amount of labor required to manually run conductors through conduits. Because the trunking bus is tapered and the distance between each combiner and junction box is relatively short, the gauge or cross-sectional area of each conductor can be optimized, with large cross-section conductors only used to carry high current. This results in reduced materials cost. For example, conductor material could be reduced by approximately 27 percent. Moreover, power losses can be reduced, for example by approximately nine percent.

BRIEF DESCRIPTION OF THE DRAWINGS

The foregoing and other advantages of the invention will become apparent upon reading the following detailed description and upon reference to the drawings.

Figure 1:
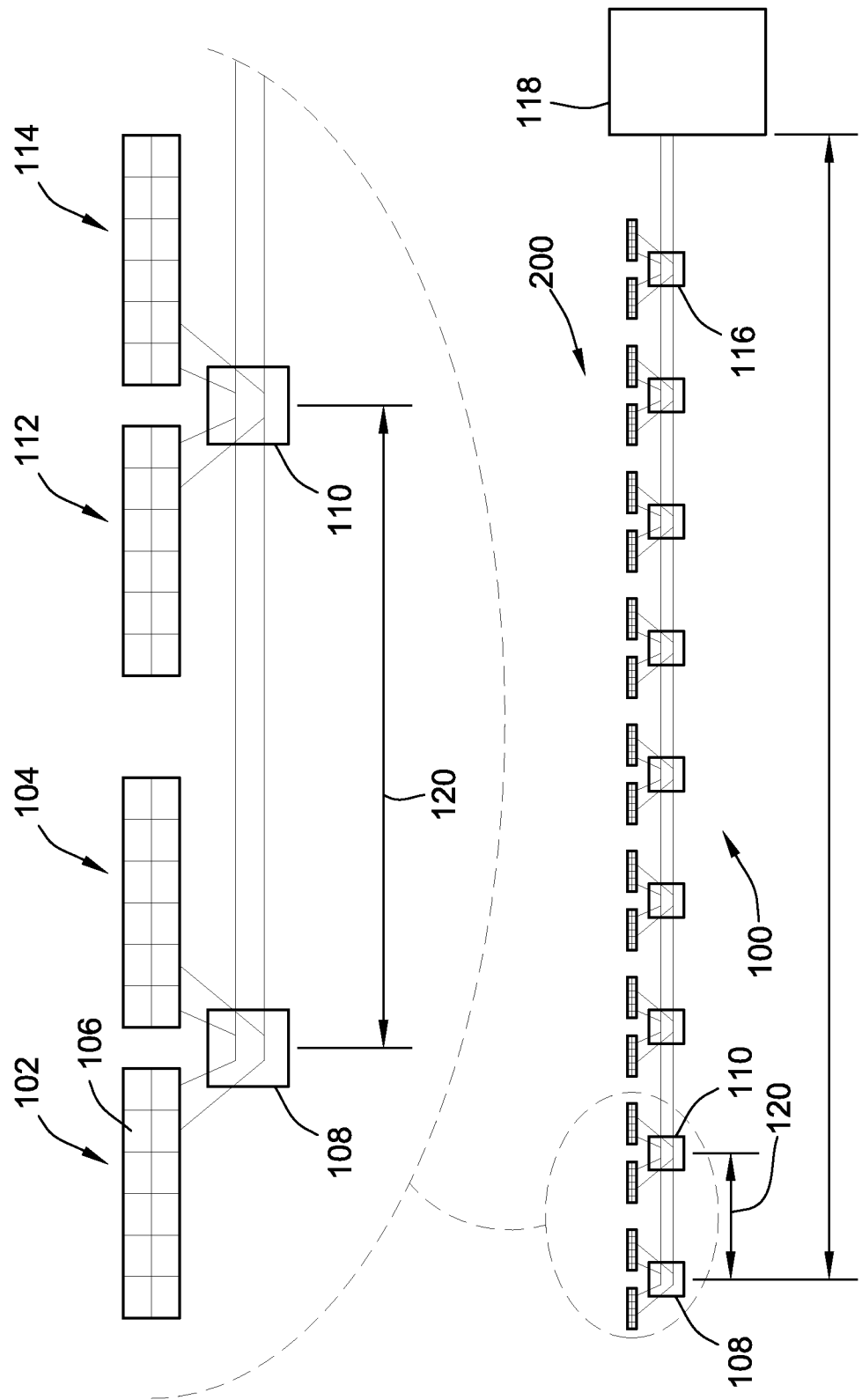
FIG. 1 is an exploded block diagram of a solar panel system according to an aspect of the present disclosure.

While the invention is susceptible to various modifications and alternative forms, specific embodiments have been shown by way of example in the drawings and will be described in detail herein. It should be understood, however, that the invention is not intended to be limited to the particular forms disclosed. Rather, the invention is to cover all modifications, equivalents, and alternatives falling within the spirit and scope of the invention as defined by the appended claims.

DETAILED DESCRIPTION OF THE ILLUSTRATED EMBODIMENTS

Figure 2:
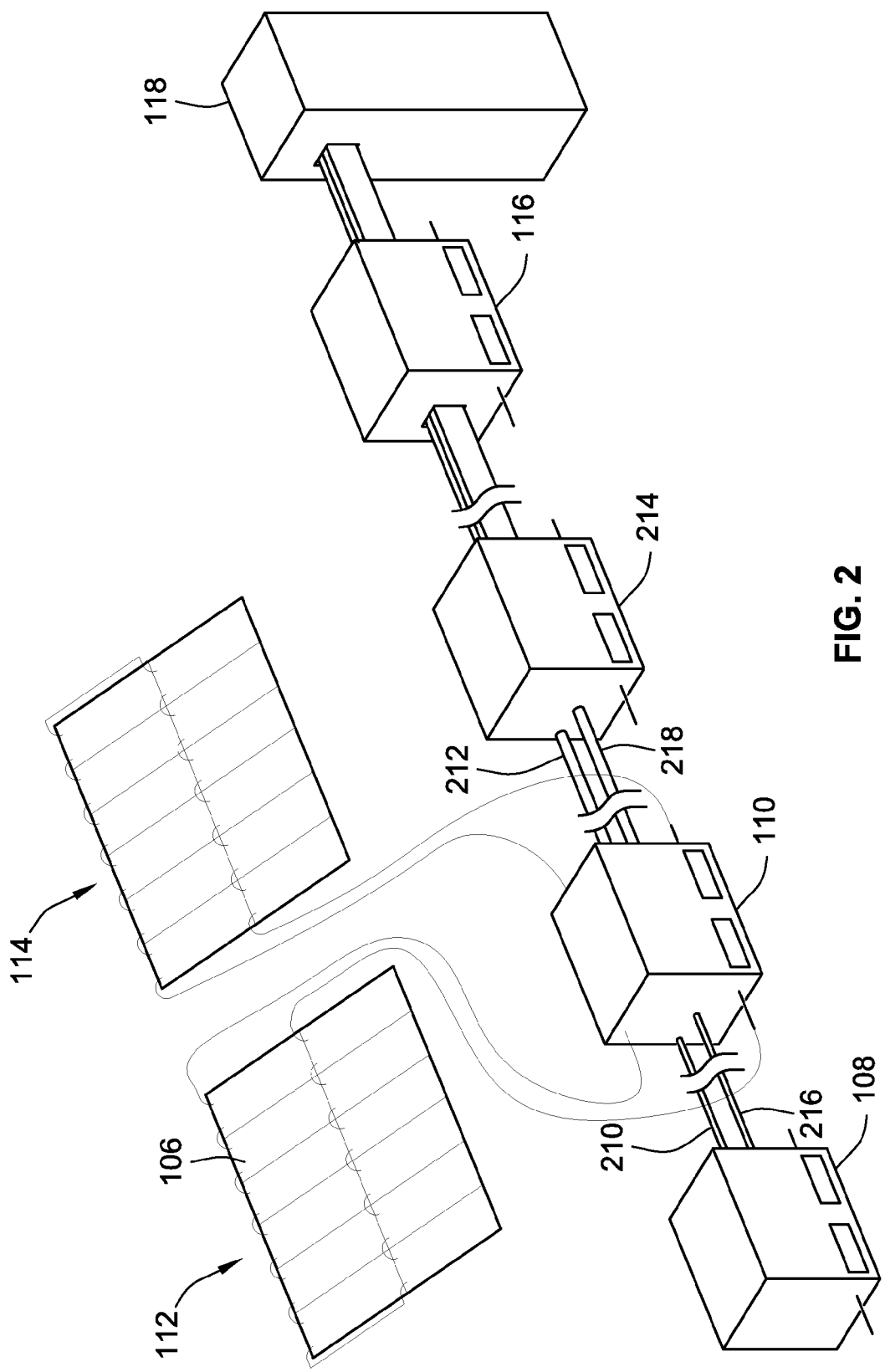
FIG. 2 is a perspective view of a tapered trunking bus in accordance with an aspect of the present disclosure.

FIG. 1 shows an exploded block diagram of a tapered trunking bus 100 for a row of solar panel arrays 200. FIG. 2 shows a perspective view of the tapered trunking bus 100. As shown in FIG. 1, the row of arrays 200 has nine pairs of arrays, including arrays 102, 104, 112, and 114. Each array can include several solar panels 106, for example twelve solar panels arranged in series in two rows of six panels. FIG. 2 shows arrays 112 and 114 as including panels 106 wired in series.

Each pair of arrays is electrically connected to a combiner and junction box. For example, arrays 102 and 104 are connected to the combiner and junction box 108 and arrays 112 and 114 are connected to the combiner and junction box 110. All of the combiner and junction boxes are connected in series. For example, the combiner and junction box 108 is connected in series with the combiner and junction box 110, which is connected in series with a combiner and junction box 214. The last combiner and junction box 116 in the series is connected to a safety switch 118. For almost every pair of solar panel arrays, the length of the conductors carrying current from each pair of solar panel arrays to the next pair is shorter than the distance between each array and the safety switch 118.

In this example, as shown in FIG. 1, the pairs of arrays in the row 200 are separated by approximately 42 feet. Thus, each combiner and junction box is separated from the next in the series by approximately 42 feet (102). Each solar panel 106 generates approximately 50 VDC at 8.5 A. Therefore, each array generates approximately 600 VDC at 8.5 A.

The first combiner and junction box 108 combines the current from the attached arrays 102 and 104 and outputs the combined approximately 17 A at 600 VDC on conductor 210. The next combiner and junction box 110 receives the current carried on conductor 210 and combines that current with the current received from attached arrays 112 and 114 (an additional 17 A at 600 VDC) and outputs the combined current of 34 A at 600 VDC on conductor 212. Combiner and junction box 214 and the remaining successive combiner and junction boxes each add approximately 17 A at 600 VDC to the current, for a total of approximately 155 A delivered to the safety switch 118.

Because conductor 210 is carrying only 17 A for a distance of approximately 42 feet, it can be implemented as a wire or cable of appropriate gauge run through a conduit. The conductor 212 is configured to carry an additional 17 A; thus it can be implemented as a wire or cable of higher gauge than the conductor 210 run through a conduit. Conductors configured to carry currents less than approximately 100 A can be implemented as wires or cables. Conductors expected to carry higher currents (e.g., currents above 100 A) can be implemented as rigid metal bus bars, for example bus bars made of copper, aluminum, aluminum with copper deposition, and/or silver flash. As the current progressively increases between combiner and junction boxes, bus bars of progressively larger cross-sectional area can be chosen. Additional negative current conductors can be implemented between each combiner and junction box in like fashion. The negative conductors implemented as wires or cables can be carried in the same conduits as the respective positive conductors. For example, the conductor 210 can be carried in the same conduit as a respective negative conductor (not shown). Additionally, each combiner and junction box can be connected to subsequent combiner and junction boxes by ground conductors to protect against instances where a grounded combiner and junction box becomes inadvertently energized due to insulation failure or installation error. For example, the combiner and junction box 108 can be connected to the combiner and junction box 110 with a ground conductor 216, and the combiner and junction box 110 can be connected to the combiner and junction box 214 by a ground conductor 218. If the housings of the combiner and junction boxes 108 and 110 are a conductor (e.g., metal), the ground conductors 214 and 216 can be connected directly to the housings, for example by screws. The conductor 218 can be of a greater cross-sectional area than the conductor 216 (e.g., of a higher gauge). Alternately, the conductors 216 and 218 can have the same cross-sectional area (e.g., the same gauge).

Figure 3:
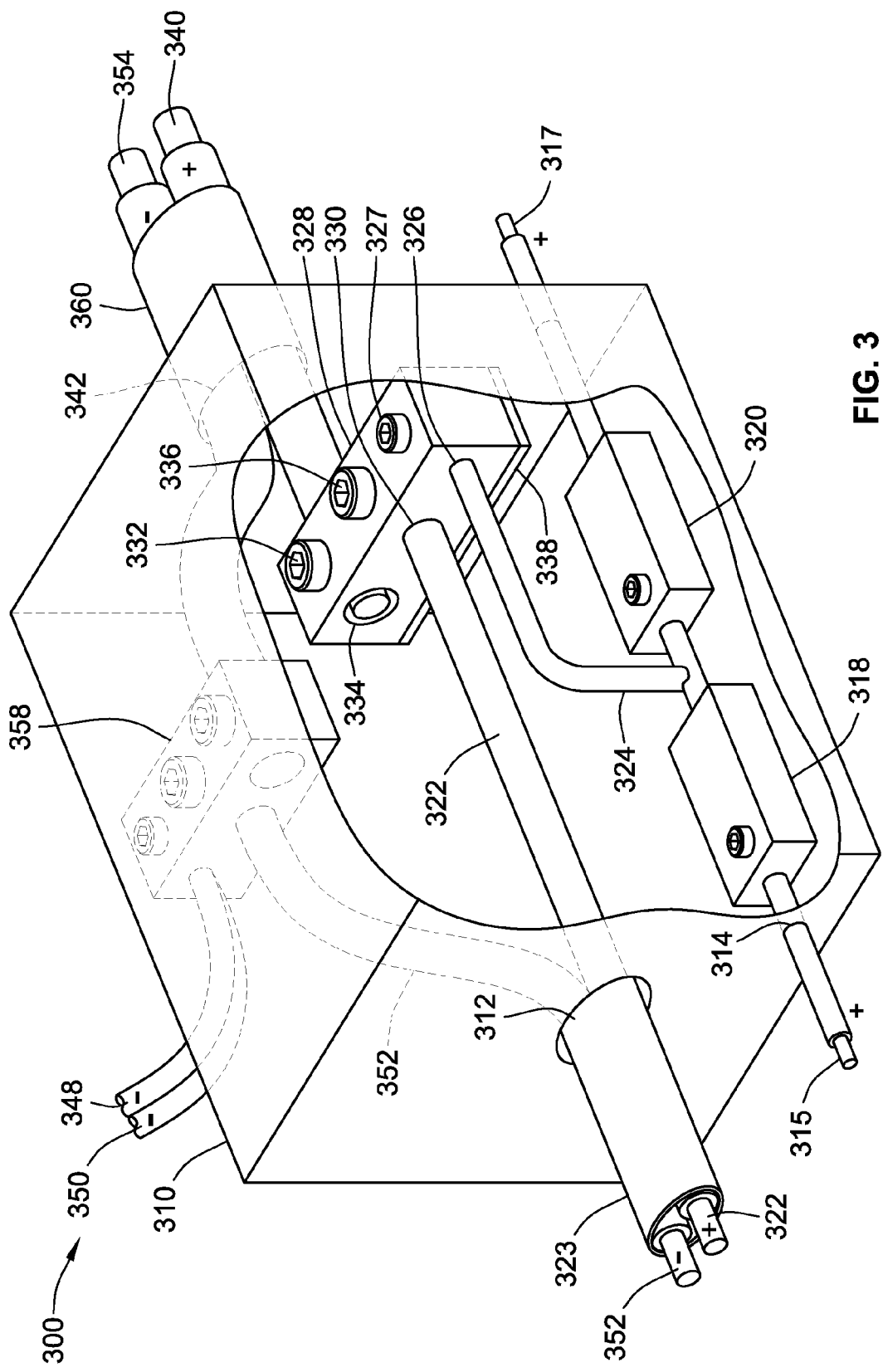
FIG. 3 is an exploded perspective view of a combiner and junction box in accordance with an aspect of the present disclosure.

FIG. 3 shows a perspective view of an embodiment of a combiner and junction box 300. The combiner and junction box 300 includes a housing 310, which can be a metal or plastic housing. The housing 310 includes a hole 312 for an input conductor 322. In this example, the input conductor 322 is a cable carried in a conduit 323. The housing 310 also includes holes 314, 316 that accept conductors 315, 317 from two solar panel arrays. The conductors 315 and 317 are connected to circuit protection devices such as fuses 318, 320 (e.g., 10 A fuses). Alternatively, circuit breakers or other circuit protection devices could be used. A bus 324 carries current from the two fuses 318, 320 to a combiner and adaptor transition 328 that combines the current from the fuses with the current from the input conductor 322. The combiner and adaptor transition 328 can be a connector with three through-holes 326, 330, 334, the through-hole 334 having a larger diameter than the through-hole 330. The combiner and adaptor transition 328 is constructed of a conductive material and can include an insulated mounting base 338 for mounting on the housing 310. During installation, an electrician can strip approximately ½ inch of insulator from the input conductor 322 and feed the conductor 322 through the hole 330 in the combiner and adaptor transition 328 such that the uninsulated portion is in the combiner and adaptor transition 328. A set screw 336 (e.g., an Allen screw) can be tightened to hold the conductor 322 in place. Alternately, the conductor 322 can be inserted into the hole 330 with insulation, and the set screw 336 can be a conductive screw (e.g., a brass screw) that is configured to pierce the insulation of the conductor 322 bringing the conductor 322 into conductance with the combiner and adaptor transition 328.

The bus 324 can be inserted into the hole 326 and joined with the combiner and adaptor transition 328 with a set screw 327 (e.g., an Allen screw or a conductive screw). A larger-gauge output conductor 340 (with a portion stripped of insulation or with insulation) can be inserted in the larger through-hole 334 and tightened in place with a set screw 332 (e.g., and Allen screw or a conductive screw). The housing 310 includes a hole 342 through which the output conductor 340 exits. The output conductor 340 can be a cable carried in a conduit 360. The combiner and adaptor transition 328 serves as a junction between the smaller and larger gauge input and output conductors.

The input and output conductors 322 and 340 can carry positive current. The housing 310 can also accept a negative input conductor 352 and a negative output conductor 354 for carrying negative current. The negative input conductor 352 can be carried to the housing 310 along with the positive input conductor 322 in the conduit 323 and can enter the housing 310 through the hole 312. The negative output conductor 354 can exit the housing 310 through the hole 342 and can be carried from the housing 310 along with the positive output conductor 340 in the conduit 360. The negative output conductor 354 can have a higher gauge than the negative input conductor 352. The combiner and junction box 300 can also receive conductors 348 and 350 carrying negative current from the pair of solar panel arrays (not shown). The negative input conductor 352 can be joined to the conductors 348 and 350 using a combiner and adaptor transition 358 in the same manner as that described above for the positive current, although the negative or ground current need not be fused. The combined negative current can be transitioned to the higher-gauge output conductor 354 using the combiner and adaptor transition 358 in the same manner as that described above for the position current.

Figure 5:
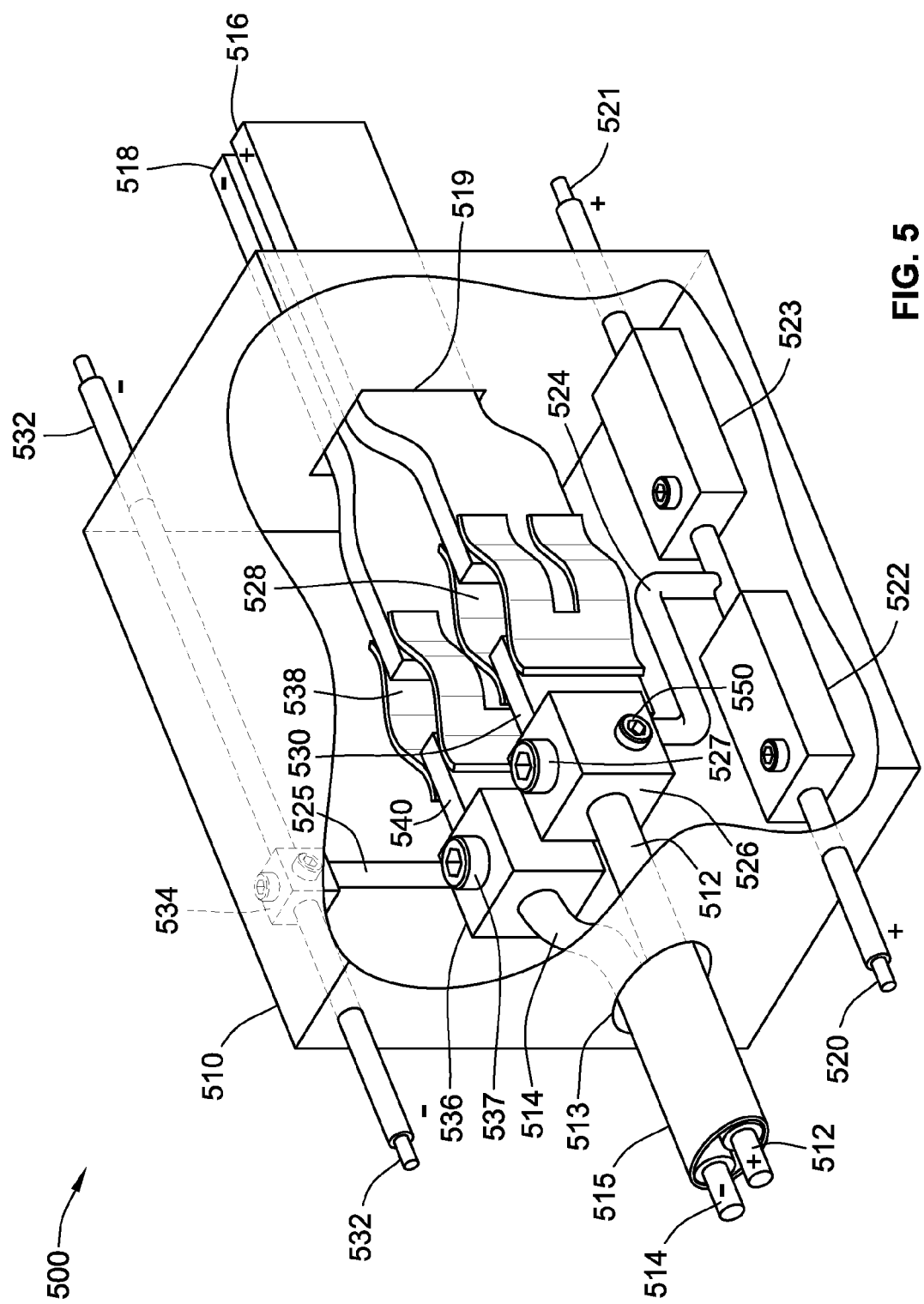
FIG. 5 is an exploded perspective view of a different combiner and junction box than shown in FIGS. 3 and 4.

FIG. 5 illustrates a combiner and junction box 500 configured to transition between input cables and output bus bars. The combiner and junction box 500 includes an outer housing 510. A positive input conductor 512 and a negative input conductor 514 are inserted through a hole 513 in the housing 510. The input conductors 512, 514 can be cables or wires in a conduit 515. A portion of the insulation on the tip of each of the input conductors 512, 514 is stripped off (e.g., ½ inch) and inserted into a combiner block (526 and 536, respectively). The input conductors 512, 514 are held in place in the combiner blocks, for example using set screws 527, 537. Positive conductors 520, 521 are inserted into the housing 510 from a pair of solar panel arrays and connected to circuit protection devices such as fuses 522, 523 (e.g., 10 A fuses). The combined positive current from the fuses 522, 523 is carried on a conductive bus 524 to the combiner block 526. The bus 524 is inserted in the combiner 526 and held in place with a set screw 550. Negative conductors 532 are inserted into the housing 510 and held into place with a block 534. The block 534 includes holes and set screws for accepting and securing the negative conductors 532. The combined negative current from the block 534 is carried on a conductive bus 525 to the combiner block 536. The bus 525 is inserted into the combiner block 536 and held in place with a set screw (not shown).

Each combiner block 526, 536 includes a male protrusion 530, 540 formed integrally therewith made of a conductive material. Positive and negative bus bars 516, 518 are inserted through a hole 519 (or holes) in the housing 510. The bus bars 516 and 518 are made of a conductive material (e.g., copper, aluminum, or other metal or alloy) and are each insulated. Each bus bar 516, 518 is joined to a corresponding male protrusion 530, 540 of a combiner block, 526, 536 by an adaptor transition, for example jaw or spring connections 528, 538. The jaw connections 528, 538 are preferably made of a spring metal such as copper. The portions of the bus bars 516, 518 that engage the spring connections 528, 538 are not insulated. The bus bar 516 is pushed into the jaw 528, expanding the jaw 528 and causing it to apply pressure to the bus bar 516. This provides a mechanical and electrical connection between the bus bar and the protrusion 530. Similarly, the jaw 538 electrically and mechanically secures the bus bar 518 and the protrusion 540. Alternately, the bus bar 516 can be secured directly to the protrusion 530 with bolts (not shown) and the bus bar 518 can be directly secured to the protrusion 540 with bolts (not shown).

As can be seen, combiner and junction box 500 combines the current from a cable input conductor with current from solar panel arrays. It also provides a junction for transitioning from cable conductors to bus bars configured to carry a higher current. For example, the combiner and junction box 500 may be used to transition between a low-current segment and high-current segment of a tapered trunking bus, for example an input current less than 100 A and an output current above 100 A.

Figure 4:
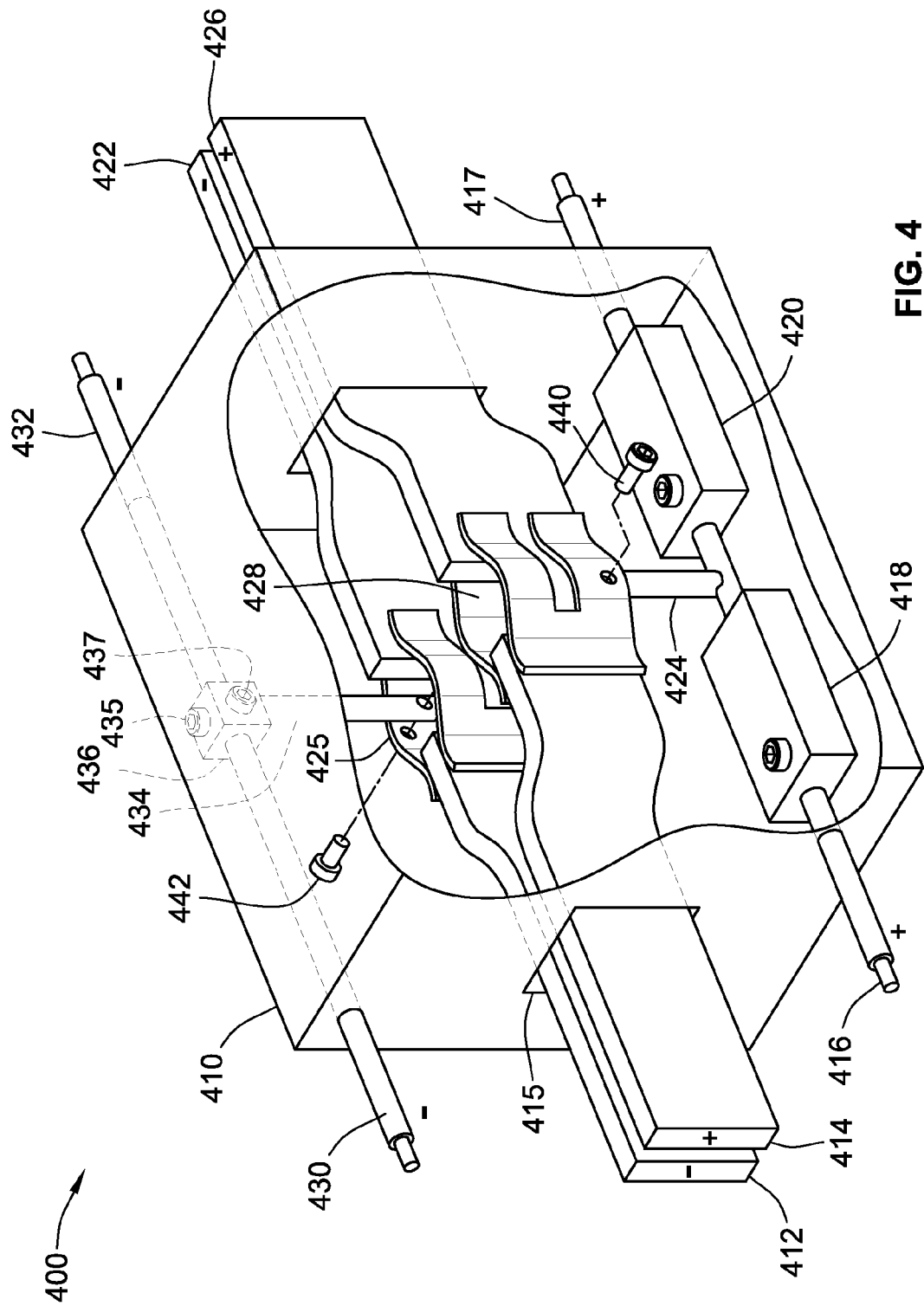
FIG. 4 is an exploded perspective view of a different combiner and junction box than shown in FIG. 3.

FIG. 4 illustrates a combiner and junction box 400 configured to transition between input bus bars and larger output bus bars. Combiner and junction box 400 includes an outer housing 410. Positive and negative input bus bars (414, 412) are inserted into the housing 410 through a hole 415. Both input bus bars are insulated from one another. The input bars 414, 412 and joined to positive and negative output bus bars 426, 422 by adaptor transitions, for example spring or jaw connections 428, 424.

Positive conductors 416, 417 carry positive current from two solar panel arrays to circuit protection devices (e.g., fuses) 418, 420 within the housing 410. The combined current from the fuses 418, 420 is carried by a bus 424 to the junction of the positive input bus bar 414 and the positive output bus bar 426. During installation, the positive bus bar 414, 426, can be inserted into the jaw connection 428. The portions of the positive bus bars 414, 426 that make contact with the jaw connection 428 are not insulated. The jaw connection 428 applies pressure to each of the bus bars 414, 426 and electrically and mechanically secures the bus bars 414, 426. The bus 424 from the fuses 418, 420 can be secured to the jaw connection 428, for example using a screw or bolt 440. Because the bus 424 can be connected to the jaw assembly 428, an electrician is free to independently install buses 414 and 426 into the jaw assembly 428.

Negative conductors 430, 432 carry negative current from the two solar panel arrays to a block 436 within the housing 410. The negative conductors 430, 432 can be secured in the block 436 with set screws 435 and 437. The combined negative current from the block is carried over a bus 434 to the junction of the negative input bus bar 412 and the negative output bus bar 422. Similar to the junction of the positive bus bars, the negative bus bars 412, 422 are mechanically and electrically joined by a jaw connection 425. The bus 434 from the block 436 can be secured directly to the jaw connection 425, for example using a screw or bolt 442.

As can be seen, combiner and junction box 400 combines the current from an input bus bar of a first cross sectional area with current from solar panel arrays. It also provides a junction for transition from bus bars of a first cross-sectional area to bus bars of a larger cross-sectional area. For example, combiner and junction box 400 may be used to transition between two high-current segments of a tapered trunking bus.

Figure 6:
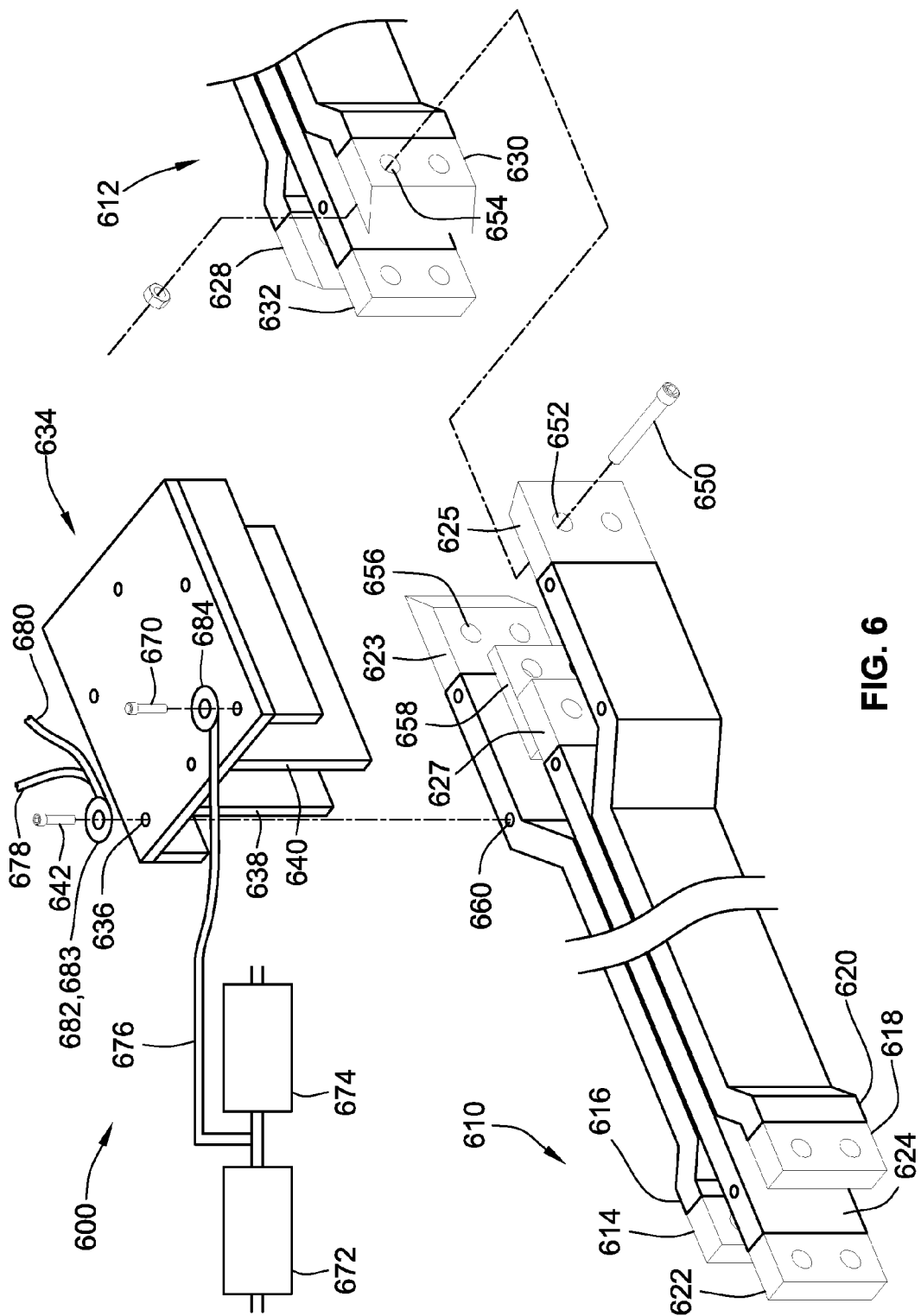
FIG. 6 is an exploded perspective view of a junction between bus bars according to an aspect of the present disclosure.

FIG. 6 illustrates an alternative junction 600 for joining bus bars. A set of mitered conductive input bus bars 610 includes a positive input bus bar 614 for carrying a positive current, a negative input bus bar 618 for carrying a negative current, and a ground input bus bar 622. Each of the input bus bars is encased in an insulator (616, 620, 624, respectively). The insulators prevent conductivity among the three input bus bars. The junction 600 mechanically and electrically joins the set of input bus bars 610 to a set of output bus bars 612. The set of output bus bars includes a positive output bus bar 628 for carrying a positive current, a negative output bus bar 630 for carrying a negative current, and a ground output bus bar 632. Similarly to the input bus bars, each of the output bus bars is encased in an insulator. The output bus bars 612 are of larger cross-sectional area than the input bus bars 610.

At the junction 600, the positive and negative input bus bars 614, 618 include arms (623 and 625 respectively) that flare out from and extend beyond a junction end 627 of the ground input bus bar 622. The arm 625 of the negative input bus bar 618 is attached to the negative output bus bar 630, for example using screws or bolts (e.g., bolt 650) that extend through holes (e.g., hole 652) in the arm 625 and into the holes 654 in the negative output bus bar 630. Similarly, the arm 623 of the positive input bus bar 614 is attached to the positive bus bar 628 using screws or bolts that extend through holes 656 in the arm 623 and into holes (not shown) in the positive output bus bar 628. The junction end 627 of the ground input bus bar 622 is attached, for example using screws or bolts, to a conductive plate 658, which in turn is attached to the ground output bus bar 632, thus securing together the input and output ground bus bars.

The junction 600 can also include a molded joint insulator 634 that includes insulating plates 638, 640. The molded joint insulator can be constructed of an insulator such as plastic. The insulating plate 638 fits between the arm 623 and the junction of the end 626 of the ground input bus bar 622 and the ground output bus bar 632. The insulating plate 640 fits between the arm 625 and the junction end 627 of the ground input bus bar 622 and the ground output bus bar 632. The molded joint insulator 634 can be fastened to the arms 623 and 625 and input and output ground bus bars 622, 632 through conductive screws or bolts (e.g., screws 642 and 670) that can be inserted through hole 636 into hole 660. The molded joint insulator 634 provides insulation to prevent conductivity between the positive bus bars and the ground bus bars or the negative bus bars and the ground bus bars.

Positive current from a pair of solar panel arrays (not shown) can be received by circuit protection devices (e.g., fuses) 672 and 674 (shown diagrammatically). The combined positive current from the fuses 672, 674 can be carried on a bus 676 to the joint insulator 634. The bus 676 can have a conductive ring 684 at its end. The conductive screw 670 can be inserted through the ring 684 and tightened to secure the bus 676 to the joint insulator 634 and the arm 625 and to provide conductivity between the bus 676 and the arm 625. Negative current from the pair of solar panels (not shown) can be carried to the joint insulator 634 by conductors 678, 680, each of which can have a conductive ring 682, 683 at its end. The conductive screw 642 can be inserted through the rings 682 and 683 and the hole 636 and tightened to secure the conductors 678, 680 to the joint insulator 634 and the arm 623 and to provide conductivity between the conductors 678, 680 and the arm 623.

Figure 7:
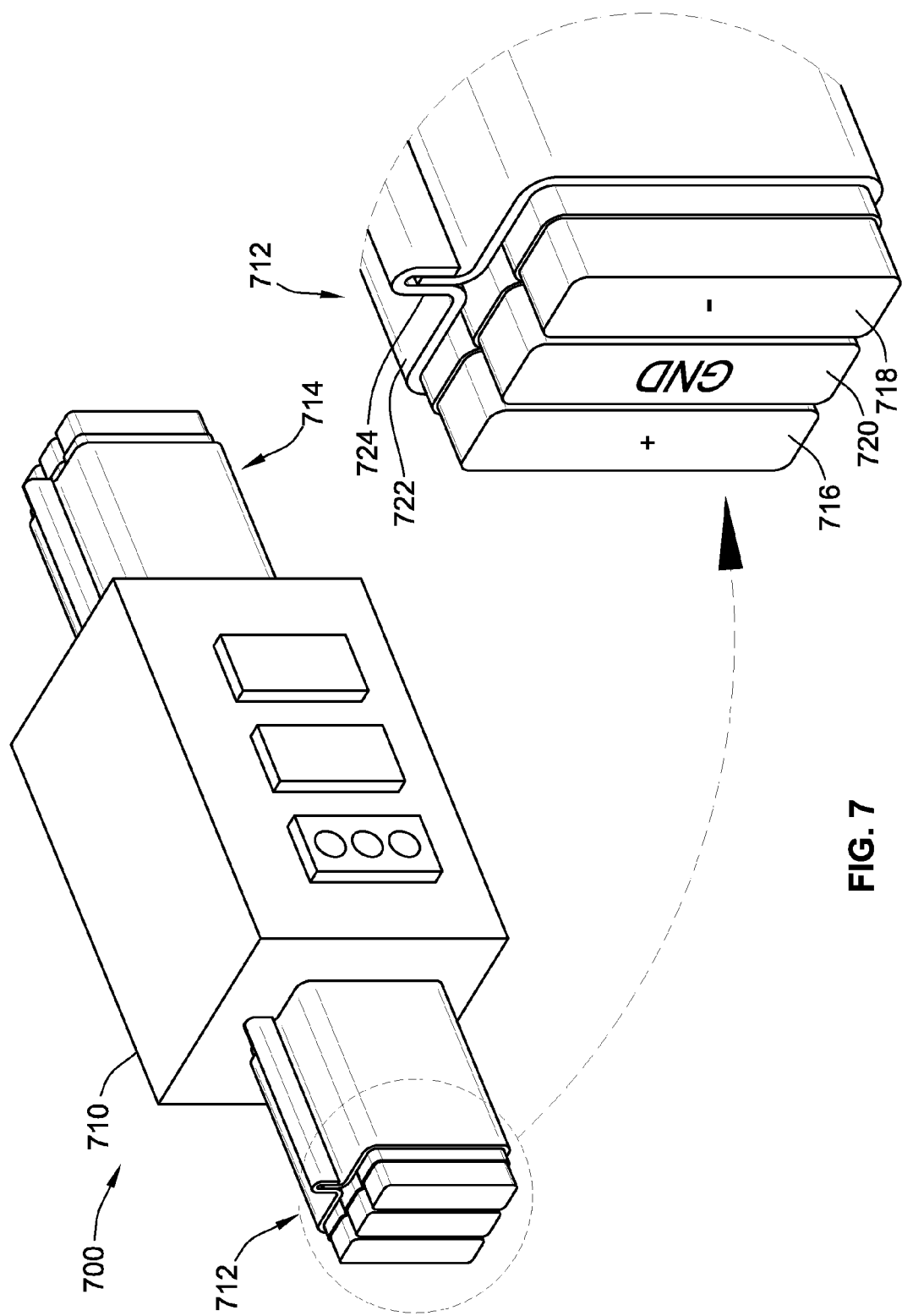
FIG. 7 is an exploded perspective view of a different combiner and junction box than shown in FIGS. 3, 4, and 5.
Figure 8:
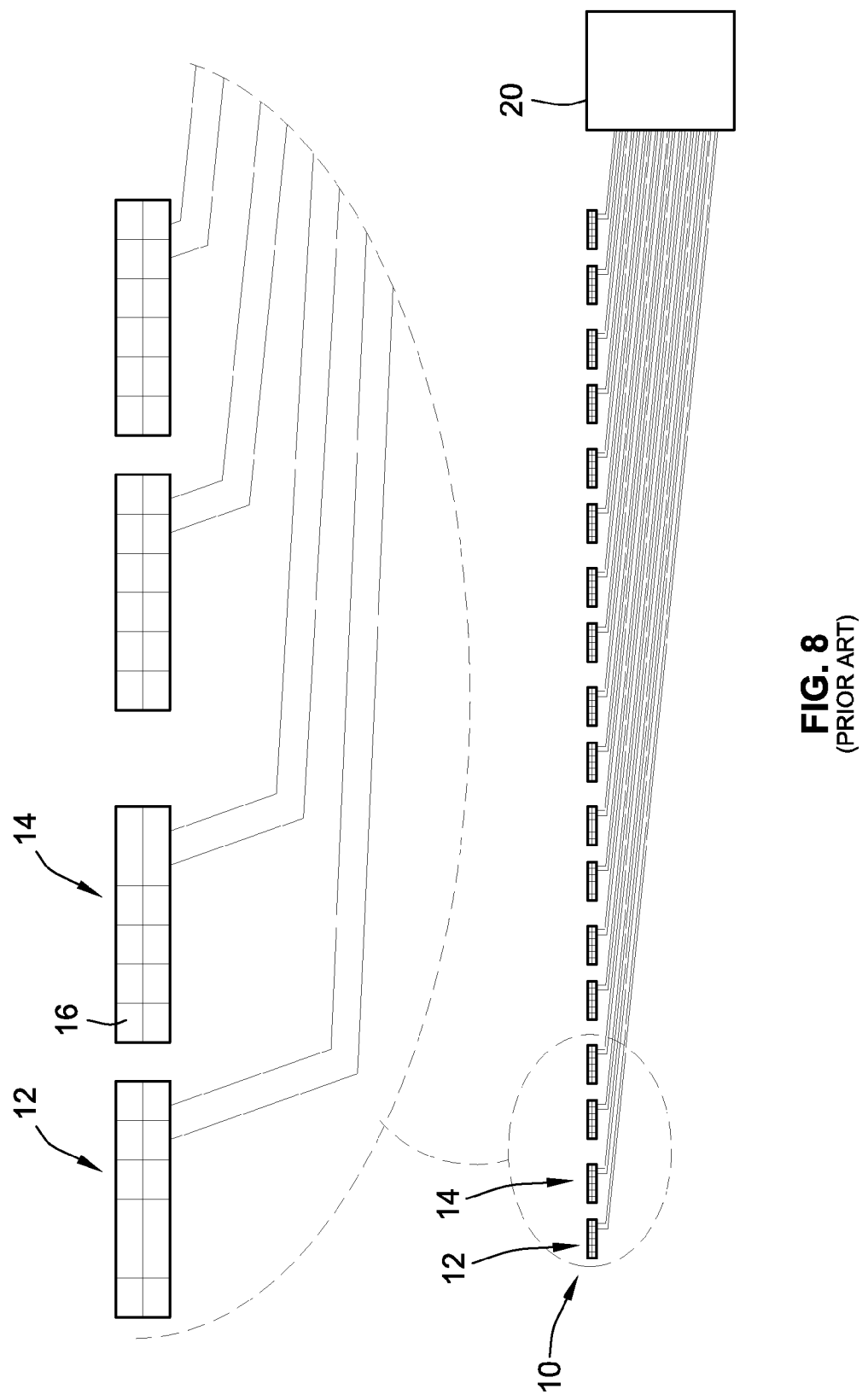
FIG. 8 is an exploded block diagram of a prior art solar panel system.

As shown in FIG. 7, sets of bus bars can be encased in roll-form housing. For example, a combiner and junction box 700 receives a set of input bus bars 712 carrying current to combine with current from solar panel arrays (not shown). The combiner and junction box 700 combines the current and is attached to a set of output bus bars 714 for carrying the higher current to the next combiner and junction box in the tapered trunking bus. The input bus bars 712 can include a positive bus bar 716, a negative bus bar 718, and a ground bus bar 720. The ground bus bar 720 may be optionally provide, for example to comply with electrical codes. As explained above, the bus bars can have arms that flare out for attachment within the combiner and junction box 700. After the bus bars are installed within the combiner and junction box 700, the portions of the bus bars exterior of the combiner and junction box can be housed and protected in a roll form housing. For example, the input bus bars 716, 718, and 720 can be packed together in a roll-form housing 722 that is crimped at the top at a water tight crimp 724. The input bus bars 716, 718, and 720 are each encased in insulation to prevent conductivity between the positive bus bar 716 and the ground bus bar 720 or the negative bus bar 718 and the ground bus bar 720. The positive and negative bus bars 716, 718 are in physical contact with the roll-form housing 722, which provides improved thermal transfer and high thermal efficiency. The higher thermal efficiency can result in a reduced bus bar cross-sectional area and corresponding reduction in conductor material and cost.

As can be seen, in a tapered trunking bus, the current increases from one segment or branch to the next. The cross-sectional area of each successive segment can be increased as the current increases, allowing an electrician or solar system designer or architect to optimize the conductors for each segment to the current they carry. The length of the conductors is also significantly shorter, as separate conductors need not be run from each array to a termination point. Instead, in a tapered trunking bus, the conductors are run only from one set of arrays to the next, making them easier to install and troubleshoot. Because the distances are relatively short, the conductors can have smaller cross-sectional areas. For example, the largest bus bar of a tapered trunking bus may have a cross-sectional area of 103 $mm^2$, compared to the combined 137 $mm^2$ cross-sectional area needed to carry current from a single array to a combiner box in the prior art example discussed above. The optimized and smaller conductor cross-sectional areas, along with the shorter distances, results in a significant reduction in materials and labor cost, for example greater than 25% for each. For example, total conductor requirements for an entire system can be reduced by approximately 27 percent and electrical losses can be reduced by approximately nine percent. By having the fuses at combiner and junction boxes rather than at a single combiner box, exposure to live conductors is decreased.

While particular embodiments and applications of the present invention have been illustrated and described, it is to be understood that the invention is not limited to the precise construction and compositions disclosed herein and that various modifications, changes, and variations can be apparent from the foregoing descriptions without departing from the spirit and scope of the invention as defined in the appended claims.

Figure 9:
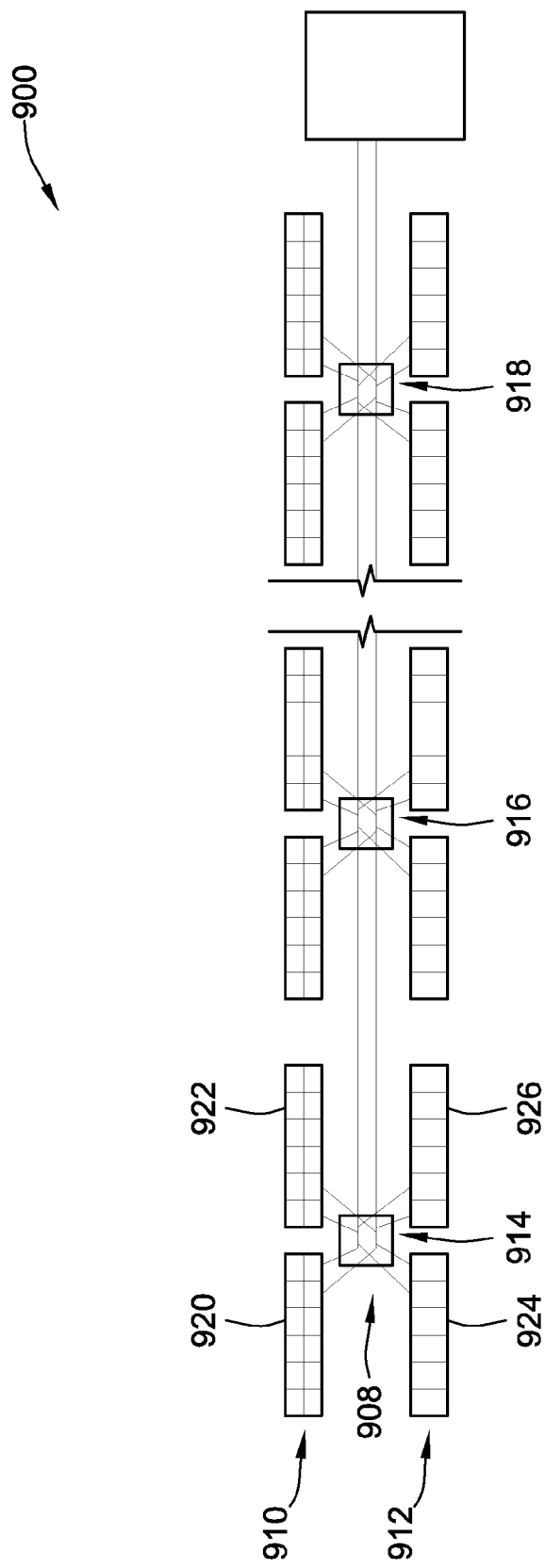
FIG. 9 is a block diagram of a different solar panel system than shown in FIG. 1.

For example, different configurations of solar panel arrays can be implemented. As shown in FIG. 9, a single tapered trunking bus 908 can be used for two rows of solar panel arrays 910, 912. In this embodiment, each combiner and junction box (914, 916, 918) of the tapered trunking bus 908 receives current from four solar panel arrays. For example, the combiner and junction box 914 receives current from solar panel arrays 920, 922, 924, and 926. The combiner and junction boxes 914, 916, and 918 are similar to those described above, except that each includes four fuses (not shown) and receives four sets of positive and negative conductors from the solar panels. The conductors connecting the combiner and junction boxes to one another can be chosen to correspond to the amount of current expected to be carried on each.

Other configurations are likewise possible. For example, each combiner and junction box could be coupled to three or more solar panel arrays from the same row. In this example, the combiner and junction boxes could be spaced farther from one another than in the examples described above. Each combiner and junction box would include an appropriate number of fuses corresponding to the number of solar panel arrays coupled to the combiner and junction box.

What is claimed is:

1. A tapered trunking bus for solar panels comprising:
a first combiner and junction box electrically coupled to a first solar panel array through a first circuit protection device within the first combiner and junction box; and
a second combiner and junction box electrically coupled to a second solar panel array through a second circuit protection device within the second combiner and junction box;
a first conductor of a first gauge configured to electrically connect the first combiner and junction box to the second combiner and junction box; and
a second conductor of a second gauge configured to supply an output current from the second combiner and junction box, the second conductor with the second gauge having a greater cross-sectional area than the first conductor with the first gauge,
wherein the second combiner and junction box includes a housing and a mechanical connector arranged inside of the housing, the housing having a first side with a first opening through which to receive the first conductor and an opposite second side with a second opening through which to receive the second conductor, the mechanical connector to receive and secure an end of the second conductor inside of the housing and to allow transition of current from the first conductor to the second conductor, and wherein the output current supplied by the second junction and combiner box is greater than a current received by the second combiner and junction box over the first conductor; and
wherein the second combiner and junction box is electrically coupled to a third solar panel array, and the output current of the second combiner and junction box comprises the input current of the second combiner and junction box combined with a current from the second solar panel array and a current from the third solar panel array, and each of the second solar panel array and the third solar panel array currents are connected within the housing to the output of the second combiner and junction box through current protection devices in the housing.

2. The tapered trunking bus of claim 1, wherein the first conductor and the second conductor are cables.

3. The tapered trunking bus of claim 2, wherein the second combiner and junction box further comprises a transition adaptor configured to transition electrical current from the first conductor to the second conductor, the transition adaptor including the mechanical connector.

4. The tapered trunking bus of claim 1, wherein the first conductor is a cable and the second conductor is a bus bar.

5. The tapered trunking bus of claim 4, wherein the second combiner and junction box further comprises a combiner configured to combine the electrical currents from the first conductor and the second solar panel array, the tapered trunking bus further comprising:
a jaw connection configured to mechanically and electrically couple the second conductor to the combiner.

6. The tapered trunking bus of claim 1, wherein the first conductor and the second conductor are bus bars, the second conductor having a larger cross-sectional area than the first conductor.

7. The tapered trunking bus of claim 6, wherein the second combiner and junction box further comprises a jaw connection configured to electrically and mechanically couple the first conductor to the second conductor.

8. The tapered trunking bus of claim 6, further comprising a roll-form housing encasing the first conductor or the second conductor.

9. An apparatus for electrically connecting solar panels to a tapered trunking bus comprising:
a first input configured to accept a first input conductor;
a first circuit protection device configured to receive an electrical current from a first solar panel array;
a second circuit protection device configured to receive an electrical current from a second solar panel array;
a combiner electrically coupled to the first input conductor, the first circuit protection device, and the second circuit protection device, the combiner configured to electrically combine the currents from the first input conductor, the first circuit protection device, and the second circuit protection device;
an adaptor transition configured to transition electrical current from the first input conductor to a first output conductor, the adaptor transition having a mechanical connector to receive and secure the first output conductor which has a gauge with a larger cross-sectional area than the first input conductor; and
a housing to house the first input, the first circuit protection device, the second circuit protection device, the combiner, the adaptor transition and the mechanical connector, the housing having a first side with a first opening through which to receive the first input conductor and an opposite second side with a second opening through which to receive the first output conductor.

10. The apparatus of claim 9, wherein the input and output conductors are cables, and the mechanical connector includes a first through hole configured to accept the first input conductor and a second through hole of larger diameter from the first through hole configured to accept the first output conductor.

11. The apparatus of claim 9, wherein the input conductor is a cable and the output conductor is a bus bar, the adaptor transition comprising a jaw connection configured to electrically and mechanically couple the output conductor to the combiner.

12. The apparatus of claim 9, wherein the input and output conductors are bus bars, the output conductor having a larger cross sectional area than the input conductor, the adaptor transition comprising a jaw connection configured to electrically and mechanically couple the input conductor to the output conductor.

13. The apparatus of claim 9, further comprising:
a second input configured to accept a second input conductor, wherein the first input conductor carries a positive electrical current and the second input conductor carries a negative electrical current;
a second combiner electrically coupled to the second input conductor, the first solar panel array, and the second solar panel array, the second combiner configured to electrically combine negative currents from the second input conductor, the first solar panel array, and the second solar panel array; and a second adaptor transition configured to transition electrical current from the second input conductor to a second output conductor, the adaptor transition having a second mechanical connector to receive and secure the second output conductor which has a gauge with a larger cross-sectional area than the second input conductor, wherein the housing houses, the second input, the second combiner, the second adaptor transition and the second mechanical connector.

14. The apparatus of claim 9, wherein
the first input conductor comprises a cable and an insulator; and
the combiner comprises a screw configured to pierce the insulator to electrically couple the first input conductor to wires received from the first circuit protection device and the second circuit protection device.

15. A solar panel system comprising:
a plurality of solar panel arrays;
a plurality of electrical conductors; and
a plurality of junction and combiner boxes, each junction and combiner box configured to accept one of the plurality of electrical conductors as an input conductor and another of the plurality of electrical conductors as an output conductor, each junction and combiner box further configured to accept an electrical connection from one of the plurality of solar panel arrays,
each junction and combiner box configured to combine electrical current received from the solar panel array through a current protection device with current received from the input conductor and to output the combined electrical current on the output conductor;
wherein the output conductor of one of the junction and combiner boxes is configured to be accepted as the input conductor of another of the junction and combiner boxes; and
wherein, for each of the plurality of junction and combiner boxes, the cross-sectional area of the output conductor is greater than the cross-sectional area of the input conductor; and
wherein one of the plurality of junction and combiner boxes includes a housing and a mechanical connector arranged inside of the housing, the housing having a first side with a first opening through which to receive the input conductor and an opposite second side with a second opening through which to receive the output conductor, the mechanical connector to receive and secure an end of the output conductor inside of the housing and to allow transition of current from the input conductor to the output conductor; and
each current protection device being located in the housing.

16. The solar panel system of claim 15, further comprising a switch electrically coupled to the highest gauge output conductor.

17. The solar panel system of claim 15, wherein, for each of the junction and combiner boxes, the output conductor is configured to carry a higher current than the input conductor.

18. The solar panel system of claim 15, wherein the conductors configured to carry current less than 100 A comprise cables in conduits.

19. The solar panel system of claim 15, wherein the conductors configured to carry current greater than 100 A comprise bus bars.

20. The tapered trunking bus of claim 1, further comprising:
a third combiner and junction box electrically coupled to a third solar panel array; and
a third conductor of a third gauge having a cross-sectional area greater than the second gauge and configured to supply an output current from the third combiner and junction box, wherein the output current supplied by the third junction and combiner box is greater than a current received by the third combiner and junction box over the second conductor.

21. The tapered trunking bus of claim 1, wherein the mechanical connector comprises:
a body having a plurality of holes including a first hole to receive therein an end of the first conductor extending into the housing through the first side and a second hole to receive therein the end of the second conductor extending into the housing through the second side; and
a plurality of set screws including a first set screw extending into the first hole to secure the first conductor in the first hole and a second set screw extending into the second hole to secure the second conductor in the second hole.

22. The tapered trunking bus of claim 21, wherein the body of the mechanical connector includes two opposing sides, and the plurality of holes are spaced apart through-holes which are arranged side-by-side in the body of the mechanical connector and extend between the two opposing sides,
wherein the first conductor is received in the first hole from one of the two opposing sides, and the second conductor is received in the second hole from the other of the two opposing sides.

23. The tapered trunking bus of claim 22, wherein the plurality of holes further includes a third hole to receive a bus to carry current from the second solar panel array, and the plurality of set screws includes a third set screw to secure the bus in the third hole.

24. The tapered trunking bus of claim 22, comprising two of the mechanical connectors inside of the housing,
wherein the first conductor is a conduit having a first positive conductor and a first negative conductor, and the second conductor is a conduit having a second positive conductor and a second negative conductor, and
wherein a first one of the two mechanical connectors receives and secures an end of the first positive conductor and an end of the second positive conductor in respective holes using the set screws, and a second one of the two mechanical connectors receives and secures an end of the first negative conductors and an end of the second negative conductors in respective holes using the set screws.

* * * * *